Figure 1:
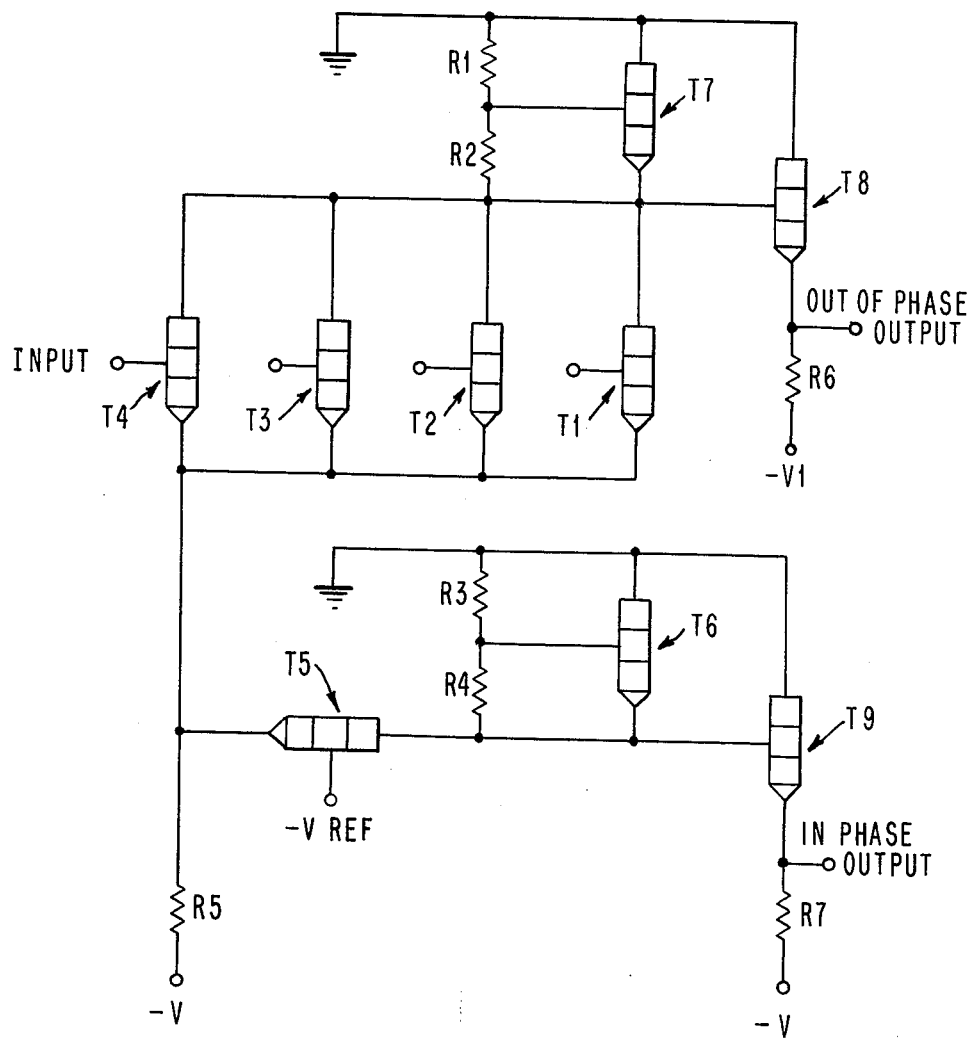

United States Patent [19]
Gani et al.

[11] 4,112,314
[45] Sep. 5, 1978

[54] LOGICAL CURRENT SWITCH

[75] Inventors: Venkappa Laxmappa Gani; Frank Alfred Montegari, both of Wappingers Falls, N.Y.

[73] Assignee: International Business Machines Corporation, Armonk, N.Y.

[21] Appl. No.: 827,929

[22] Filed: Aug. 26, 1977

[51] Int. Cl.² .................. H03K 19/08; H03K 19/12; H03K 19/30; H03K 19/34
[52] U.S. Cl. .................................. 307/215; 307/213; 307/218; 307/317 A
[58] Field of Search ............... 307/203, 213, 214, 215, 307/218, 317 A

[56] References Cited

U.S. PATENT DOCUMENTS

| | | | |
|---|---|---|---|
| 3,259,761 | 7/1966 | Narud et al. | 307/215 |
| 3,458,719 | 7/1969 | Weiss | 307/214 X |
| 3,508,076 | 4/1970 | Winder | 307/215 X |
| 3,509,362 | 4/1970 | Bartholomew | 307/218 X |
| 3,573,488 | 4/1971 | Beelitz | 307/215 X |
| 3,716,722 | 2/1973 | Bryant et al. | 307/215 |
| 3,742,250 | 6/1973 | Kan | 307/317 A X |
| 3,751,680 | 8/1973 | Hodges | 307/317 A X |
| 3,760,200 | 9/1973 | Taniguch et al. | 307/317 A X |
| 3,769,524 | 10/1973 | Mathews | 307/214 X |
| 3,806,736 | 4/1974 | Wilhelm | 307/215 |

OTHER PUBLICATIONS

Blumberg et al., "Self–biased, Low Voltage, Emitter–Followerless Current Switch", *IBM Tech. Discl. Bull.;* vol. 16, No. 3, p. 1017; 8/1973.

Chang, "Low Barrier SBD Pull–Down Driver Current Switch"; *IBM Tech. Discl. Bull.;* vol. 20, No. 2, pp. 601–602; 7/1977.

Dorler et al., "Integrated Schottky Diode and Transistor Circuit"; *IBM Tech. Discl. Bull.;* vol. 14, No. 11; pp. 3214–3215; 4/1972.

Culican, "Logic Block Coincident Circuit"; *IBM Tech. Discl. Bull.;* vol. 20, No. 1, pp. 174–175; 6/1977.

*Primary Examiner*—Larry N. Anagnos
*Attorney, Agent, or Firm*—Wesley DeBruin

[57] ABSTRACT

A logical current switch responsive to a plurality of input logical signals having predetermined voltage swings and including in a first circuit arrangement parallel-connected bipolar transistors responsive to the logical signal levels of the input signals, and including in a second circuit arrangement a single bipolar transistor responsive to a logical function of the input signals via Schottky barrier diodes. Each of the above arrangements being connected with a further ground-biased transistor and including a Schottky barrier diode for coupling the emitter of the input signal responsive bipolar transistor to the emitter of the ground-biased bipolar transistor so as to result in circuits for producing complementary output signal level swings of a magnitude equal to the input logical signal voltage level swings.

6 Claims, 7 Drawing Figures

PRIOR ART

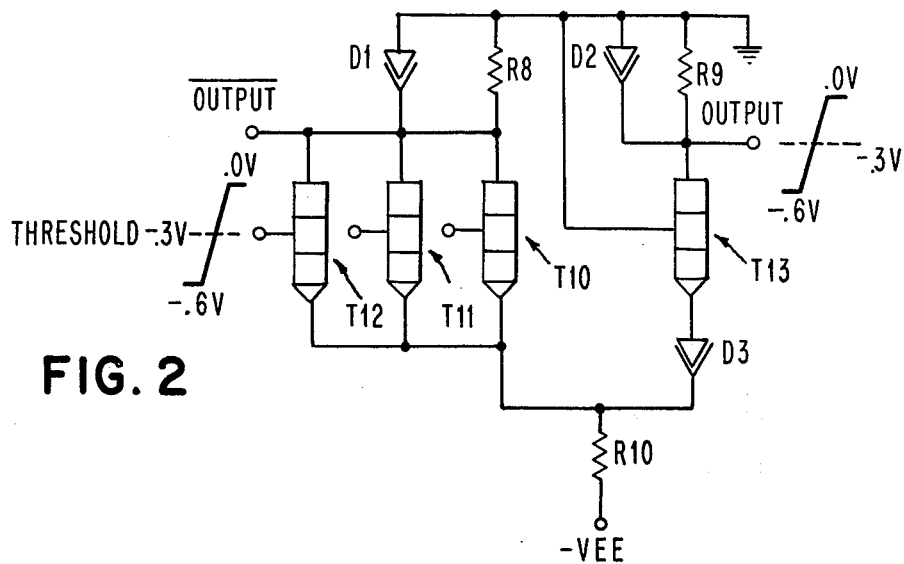
FIG. 2
FIG. 3
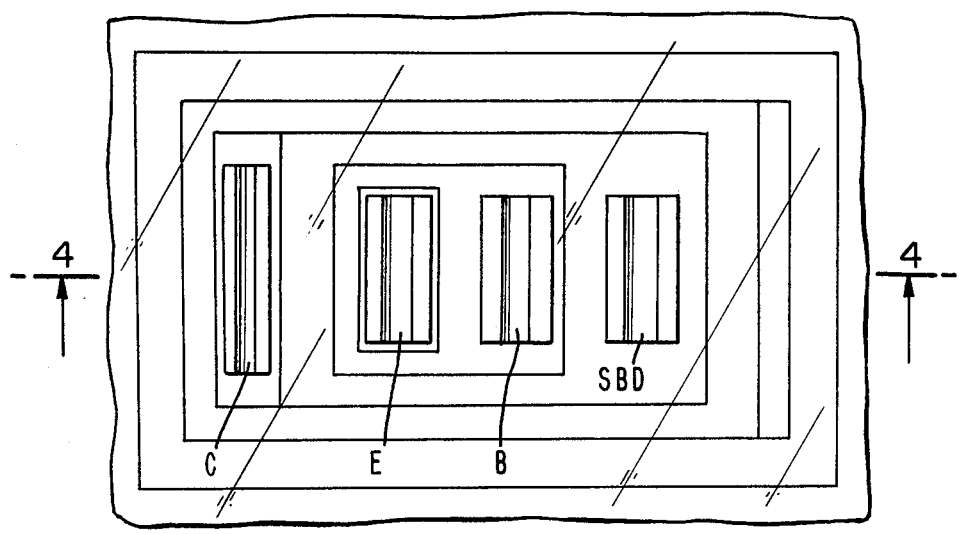
FIG. 4
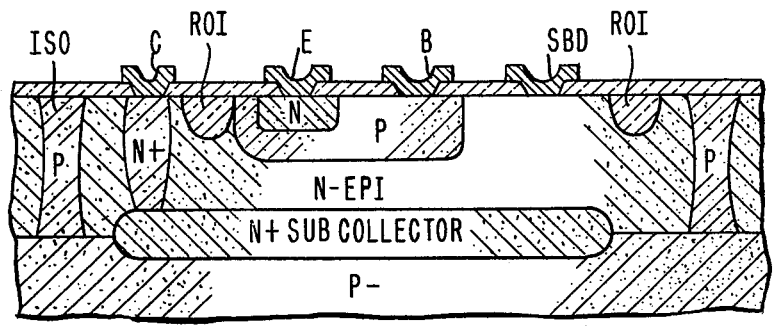

LOGICAL CURRENT SWITCH

BACKGROUND OF THE INVENTION

1. Field of the Invention

The invention relates to an improved solid state logical current switch which is readily fabricated by large scale integration techniques. The improved integrated circuit logical current switch is particularly advantageously employed in high speed data processing systems and the like.

2. Description of the Prior Art

Numerous logical current switch circuits also termed "current mode switching circuits" or "emitter coupled logic circuits," are known to the art.

Current mode switching is well suited for high speed digital systems, for example, electronic computers and other electronic apparatus, since the transistors therein can be operated out of saturation with relatively small voltage swings, which may be in the order of a fraction of a volt. The avoidance of transistor saturation and the small voltage excursions enable current mode switching circuits to have a high speed of response.

One known type of current mode switching circuit includes at least two transistors having separate collector circuits and a common emitter circuit in which a current source is connected. The current source may be simulated by a source of operating potential and a common signal current path, such as a resistor. The current source current can be routed through either one of the alternate current paths provided by the collector to emitter paths of the transistors by application of a suitable difference in potential between the base electrodes thereof. When this type of current mode switching circuit is utilized as a logic gate, the difference in potential is achieved by applying relatively high (HI) and relatively low (LO) binary signal voltage levels to one transistor base electrode and a reference voltage (Vref) to the other transistor base electrode. A value intermediate to the HI and LO signal levels is assigned to Vref so that the potential difference between the two signal levels and Vref controls which of the transistors the current is routed through. This type of logic gate is commonly termed a current mode logic (CML) gate, a current switch logic (CSL) gate or an emitter coupled logic (ECL) gate.

In the usual type CML gate, complementary outputs are taken from the collector electrodes of the transistors. Each of the complementary outputs is often buffered by a separate emitter-follower (common collector) transistor. The dual emitter-follower transistors provide the CML gate with a low output impedance and provide signal level shift so that the output signal levels are of the same digital voltage levels as the binary input signals. Thus, the output terminals of one CML gate may be directly connected to the input terminals of not only one other CML gate, but also, due to the low output impedance, to the input terminals of several other CML gates.

Although the dual output emitter-follower transistors provide the afore mentioned benefits, they also account for about two-thirds of the power dissipation in the CML gate. Although power dissipation is generally undesirable, it is particularly so when the CML gates are fabricated as integrated circuits wherein the dissipated heat can cause serious performance degradation. The present invention is directed to novel improvements in CML gates whereby, among other advantages enumerated in detail hereinafter, the power dissipation is sizeably reduced without loss of signal gain and without loss of high performance.

Reference is made to U.S. Pat. No. 2,964,652, entitled "Transistor Switching Circuits" granted Dec. 13, 1960 to Hannon S. Yourke.

Reference is made to the description of Emitter Coupled Logic (ECL) pages 81-82 of the text "Integrated Circuits" (Texas Instruments Electronic Series) by R. G. Hibberd, Copyright 1969, McGraw-hill Book Company.

Reference is made to U.S. Pat. No. 3,418,491 entitled "Utilizing Identical Signal Levels for Logic and Inhibit Functions" granted Dec. 24, 1968 to David H. Chung and James L. Walsh. U.S. Pat. No. 3,418,491 discloses a cascode amplifier circuit comprising two transistors, one transistor adapted to receive an input signal, and provide an output; the other transistor being adapted for constant voltage operation. An inhibit transistor, connected to the other transistor, is adapted to receive an input signal and provide an output. Identical signal levels operate the inhibit and one transistor. Operation of the one transistor renders the amplifier conductive. Simultaneous operation of the inhibit and one transistor terminates conduction through the amplifier. When the inhibit signal is dropped, no delay occurs at the amplifier output since no charge storage problems occur in the other transistor.

Reference is made to U.S. Pat. No. 3,458,719 entitled "Threshold Logic Switch With A Feedback-Current Path" granted July 29, 1969 to Leonard Weiss. The Weiss patent discloses an integrated circuit current switch having a time-dependent negative feed-back path for decreasing the switching time. The feed-back signal changes the level of the reference voltage applied to the current switch thereby decreasing the required level change in the potential of the input signal for the current switch to change its state.

Reference is made to U.S. Pat. No. 3,471,713 entitled "High-Speed Logic Module Having Parallel Inputs Direct Emitter Feed to A Coupling Stage and A Grounded Base Output," granted Oct. 7, 1969 to David C. Uimari. The Uimari patent discloses a gating circuit in which the emitter outputs from a plurality of parallel connected input transistors are fed to the base terminal of an intermediate or coupling stage transistor. The emitter output of the latter is directly connected to the emitter of a grounded base saturable output transistor in a current mode configuration, and the circuit output is taken from the collector of the output transistor.

Reference is made to U.S. Pat. No. 3,509,362 entitled "Switching Circuit" granted Apr. 28, 1970 to Frederick O. Bartholomew. The Bartholomew patent discloses signal translating means responsive to binary input signals to provide overdrive signals to a current mode switch. The signal translating means includes an inverting type amplifier with a gain G for inverting the binary signals and additionally includes means for applying the binary signals and the inverted binary signals to first and second current mode switch inputs, respectively, such that the differential signal swing between the current mode switch inputs is $(1+G)$ multiplied by the binary input signal swing.

Reference is made to U.S. Pat. No. 3,521,086 entitled "Circuit Arrangement for Limiting the Output Voltage of a Logical Circuit" granted July 21, 1970 to Arie Slob. The Slob patent discloses a circuit arrangement for maintaining the output signal of an emitter coupled logic circuit at a non-varying value with respect to a voltage reference point in which the input logic element branches are connected to an output point through an amplifier. The output point is maintained at the non-varying value by being connected to the reference point through the base-emitter barrier layer of a transistor the collector of which is connected to the amplifier in negative feedback relationship.

Reference is made to U.S. Pat. No. 3,523,194 entitled "Current Mode Switch" granted Aug. 4, 1970 to Alfredo Sheng. The Sheng patent discloses current mode switching circuits having dual output emitter-follower output transistors. Power dissipation is reduced by switching a common load current path from one to the other output terminal as determined by the binary significance of the digital input signals, whereby the emitter current of only one of the emitter-follower transistors flows through the common path under steady state conditions.

Reference is made to U.S. Pat. No. 3,597,626 entitled "Threshold Logic Gate" granted Aug. 3, 1971 to John D. Heightley. The Heightley patent discloses a threshold logic gate comprising a threshold circuit and an input signal combining circuit including a non-linear impedance element. The non-linear impedance replaces the usual linear summing resistor in the input signal combining circuit and provides a low impedance below the gate threshold level and a high impedance in the gap. The low impedance below the gate threshold level permits a large fan in with a small overall signal swing on the threshold circuit, providing the gate with high speed operation and low power dissipation. At the same time the high impedance presented in the gap provides the gate with a large gap, thereby reducing the sensitivity requirements on the threshold circuit.

Reference is made to U.S. Pat. No. 3,751,680 entitled "Double-Clamped Schottky Transistor Logic Gate Circuit" granted Aug. 7, 1973 to David A. Hodges. The Hodges patent discloses a gate circuit having an output terminal switchable between two levels in response to a bilevel input signal on an input terminal. A totem pole output arrangement includes a pair of series connected Schottky clamped transistors, the first acting as a pull-up and the second a pull-down transistor. A common connection between the emitter and collector of the transistors provides the output terminal. A phase-splitting OR gate is provided for driving the base inputs of the transistors in a complementary manner. The OR gate has two activating inputs, the first being responsive to a high bi-level input signal for placing the pull-down transistor in conduction and holding off the pull-up transistor. The second input is responsive only during a low bi-level input signal to the first input. It receives a feedback signal from the output terminal for controlling the pull-up transistor to maintain the output terminal at a predetermined higher voltage level.

A number of logical circuit configurations requiring only a single supply source are known to the art. See, for example: U.S. Pat. No. 3,867,644 entitled "High Speed Low Power Schottky Integrated Logic Gate Circuit with Current Boost" granted Feb. 18, 1975 to Ronald L. Cline; U.S. Pat. No. 3,766,406, entitled "ECL to TTL Converter" granted Oct. 16, 1973 to Richard W. Bryant and Goerge K. Tu; U.S. Pat. No. 3,769,524, entitled "Transistor Switching Circuit" granted Oct. 30, 1973 to Keith F. Mathews; U.S. Pat. No. 3,836,789, entitled "Transistor-Transistor Logic Circuitry and Bias Circuit" granted Sept. 17, 1974 to James R. Struk and Robert G. Werner; and U.S. Pat. No. 3,783,308, entitled "Flip-Flop Element" granted Jan. 1, 1974 to Clark R. Williams.

Reference is made to the following IBM Technical Disclosure Bulletin publications:

No. 1: "Single Supply Current Switch" by E. Colao, Vol. 16, No. 12, May 1974, page 3937. A Schottky Barrier diode is connected from the base one transistor of the current switch to ground to provide the reference potential.

No. 2: "High-Speed, Diode-Transistor Current Switch" by T. S. Jen, Vol. 8, No. 8, January 1966, page 1150. A first transistor and a diode have their respective emitter and cathode connected through a resistor, to a source of potential, the common current switch configuration; the logical input is applied to the base of said first transistor. The collector potential of said first transistor and the anode potential of said diode are transmitted to the base inputs of a succeeding current switch which includes third and fourth transistors. The circuits complementary outputs are taken from the collectors of said third and fourth transistors.

No. 3: "Self-Biased, Low Voltage, Emitter-Followerless Current Switch" by R. J. Blumberg, J. A. Dorler and W. S. Homa. A plurality of input signals are received at the bases of a plurality of input switching transistors. The bias for the reference transistor is provided by a resistor network. A pair of Schottky diodes complete the internal biasing and regulation circuitry.

No. 4: "Schottky Diode Feedback Current-Switch Circuit" by K. F. Mathews, Vol. 15, No. 6, November 1972, page 1956. A Schottky Barrier diode shunts the collector base junction of each transistor employed.

No. 5: "Schottky Diode Current Switch" by J. W. Bode and K. F. Mathews, Vol. 14, No. 7, December 1971, page 2103. A Schottky Barrier diode is employed in place of the conventional diode 10 in the current switch, as shown in FIG. 1 of the Yourke U.S. Pat. No. 2,964,652.

No. 6: "Non Inverting High Threshold D²L Circuit" by V. L. Gani and F. A. Montegari, Vol. 18, No. 8, January 1976, page 2503. The addition of a Schottky Barrier diode in the emitter circuit of the switching transistor provides a threshold 300 millivolts more positive than that of a standard D²L circuit.

No. 7: "Active Terminator For Transmission Lines" by S. D. Malaviya and P. Smetana, Vol. 18, No. 5 October 1975, page 1417. The terminator circuitry disclosed includes first and second transistors each having a level shifting Schottky Barrier diode serially connected in its emitter circuit.

SUMMARY OF THE INVENTION

A primary object of the invention is to provide an improved current switch.

A further object of this invention is to provide an improved emitter followerless, low power current switch requiring only a single power supply.

A still further object of the invention is to provide an improved emitter followerless, low power current switch requiring only a single power supply and utilizing ground potential as the reference potential therein.

A still further object of the invention is to provide a current switch with a Schottky Barrier Diode in series with a transistor, the base of which is returned to ground to thereby eliminate the requirement of a reference potential.

A still further object of the invention is to provide an improved logical current switch which is readily fabricated in semiconductor integrated circuit form by known integration techniques, has a high switching speed, and has reduced power consumption.

A still further object of the invention is to provide an improved logical current switch which requires less planar silicon area when fabricated as an integrated circuit within a silicon monolithic structure in accordance with known large scale integration techniques.

A still further object of the invention is to provide a large number of logical inputs in a minimum of silicon area by employing Schottky barrier diodes as logic elements.

A still further object of the invention is to provide a large number of logical inputs whose number does not detract from the performance of the circuit.

In accordance with the invention an improved logical current switch is provided. Said logical current switch being adapted to receive a plurality of logical inputs each having a predetermined voltage swing with reference to a threshold voltage and providing a first in phase logical output and a second out of phase logical output, said first and second outputs each having said predetermined voltage swing with respect to said threshold voltage, said logical outputs each being a predetermined logical function of said plurality of logical inputs, said logical current switch being characterized by requiring only a single power supply coupled to at least first and second bipolar transistors having a Schottky barrier diode connected between the emitters of said at least first and second transistors.

In accordance with the invention a logic circuit requiring a single power supply and adapted to receive a plurality of logic inputs having a predetermined signal swing magnitude and providing an in phase output and out of phase output respectively, representing a predetermined logical function of said plurality of logical inputs, said in phase output and said out of phase output respectively, possessing said predetermined signal swing is provided, said logic circuit comprising first and second transistors, each having an emitter, base and collector; a plurality of input terminals; a plurality of low forward voltage Schottky Barrier diodes respectively connecting each of said input terminals to the base of said first transistor; a high forward voltage Schottky barrier diode connected between said emitter of said first transistor and said emitter of said second transistor; a first resistor connected between said emitter of said first transistor and a source of potential; a second resistor connected between the collector of said first transistor and ground potential; a third resistor connected between the collector of said second transistor and ground potential; a direct connection between said base of said second transistor and ground potential; an in phase output terminal connected to said collector of said second transistor; and an out of phase output terminal connected to said collector of said first transistor.

In accordance with the invention a current switch logical circuit requiring only a single source of electrical potential is provided, said current switch logical circuit comprising: a plurality of transistors each having an emitter, base and collector; a first passive connection means connecting said collectors of said plurality of transistors in common; a second passive connection means connecting said emitters of said plurality of transistors in common; a plurality of input terminals respectively connected to the transistor bases of said plurality of transistors; a first resistor connected between said first connection means and ground potential; a second resistor connected between said second connection means and a potential source; an additional transistor having an emitter, base and collector; a first Schottky barrier diode connected between said emitter of said additional transistor and said second connection means; a third connection means connecting said base of said additional transistor to ground potential; a third resistor connected between said collector of said additional transistor and ground potential; and an output terminal connected to said collector of said additional transistor.

The foregoing and other objects, features and advantages of the invention will be apparent from the following more particular description of preferred embodiments of the invention, as illustrated in the accompanying drawings.

In the drawings:

FIG. 1 shows the prior art of the basic current switch emitter follower circuit with two power supplies.

FIG. 2 discloses a circuit schematic of a first embodiment of an improved logical current switch in accordance with the invention.

FIGS. 3 and 4 respectively, disclose a planar top view and a cross-sectional view of a portion of a semiconductor integrated circuit structure embodiment of the improved logical current switch in accordance with the invention. The cross-sectional view of FIG. 4 is taken along the line 4—4 of FIG. 3.

Figure 5:
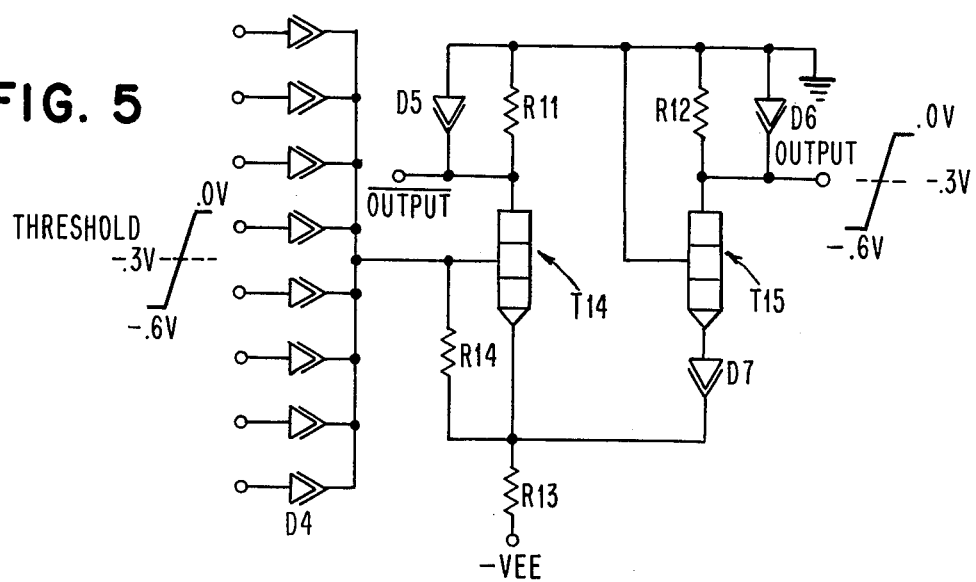

FIG. 5 discloses a circuit schematic of an embodiment of an improved logical current switch in accordance with the invention.

Figure 6:
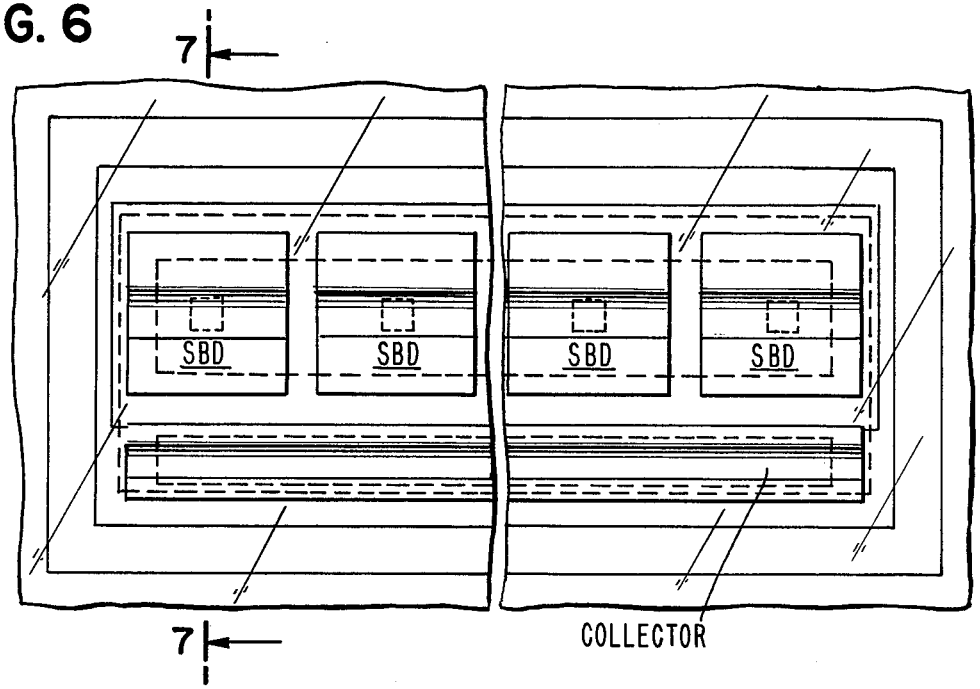
Figure 7:
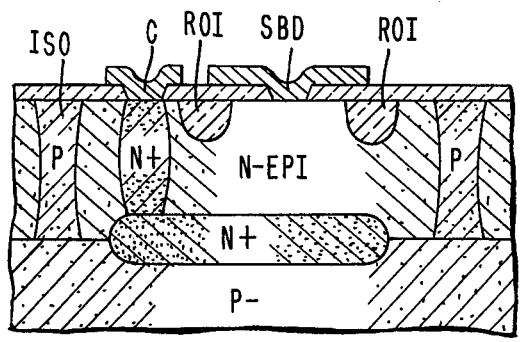

FIGS. 6 and 7 respectively, disclose a planar top view and a cross-sectional view of a portion of a semiconductor integrated circuit structure embodiment of the improved logical current switch in accordance with the invention. The cross-sectional view of FIG. 7 is taken along the line 7—7 of FIG. 6.

The single supply low power current switch depicted in FIG. 2 functions with only one power supply and uses ground in place of the commonly used reference voltage at the base of T13.

A Schottky barrier diode D3 with a low forward voltage drop of 0.3 volts is placed in the emitter circuit of T13 to allow the voltage at the emitter of T10 to assume a potential approximately 0.3 volts more negative than at the emitter of T13. This more negative T10 emitter potential is translated into a negative input threshold of approximately 0.3 volts at the base of T10.

Diodes D1 and D2 act as both saturation clamps and transition clamps by limiting the negative transitions at the collectors of T10 and T13 to −0.6 volts. With ground as the most positive potential, the forward bias across the base-collector junctions of T10 and T13 is limited to 0.6 volts thus preventing saturation of these devices. Clamping the output transition to −0.6 volts improves transient performance by providing an ample but not excessive transition below threshold under all circuit loading conditions. The clamp also serves to maintain the correct down level when additional current flows through collectors, dotted at the collector node of T13.

By providing a path for excess collector current, the clamps allow the use of a lower ratio in the value of R10 to R8, R9 which makes the output transition less dependent on the value of R8, R9 thereby making all resistor values and tracking less critical.

Diodes D1 and D2 are fabricated over the subcollector regions of T10 and T13 producing the integral, space saving structure depicted in FIGS. 3 and 4.

Logic may be extended by connecting additional transistors to the collector and emitter of T10 with the bases of the added transistors used as logic inputs. Additional D1 diodes are not needed when extending logic.

The SBD input single supply current switch depicted in FIG. 5 functions with only one power supply and uses ground in place of the commonly used reference voltage at the base of T15.

A Schottky barrier diode D7 with a forward voltage drop of 0.6 volts is placed in the emitter circuit of T15 to allow the voltage at the emitter of T14 to assume a potential approximately 0.6 volts more negative than at the emitter of T15. This more negative T14 emitter potential is translated into a level of approximately −0.6 volts at the base of T14 and further translated through diodes D4 into an input threshold of −0.3 volts.

Diodes D5 and D6 act as both saturation clamps and transition clamps by limiting the negative transitions at the collectors of T14 and T15 to −0.6 volts. With ground as the most positive potential, the forward bias across the base-collector junctions of T14 and T15 is limited to 0.6 volts thus preventing saturation of these devices. Clamping the output transition to −0.6 volts improves transient performance by providing an ample but not excessive transition below threshold under all circuit loading conditions. The clamp also serves to maintain the correct down level when additional current flows through collectors, dotted at the collector node of T15.

By providing a path for excess collector current, the clamps allow the use of a lower ratio in the value of R13 to R11, R12 which makes the output transition less dependent on the value of R11, R12 thereby making all resistor values and tracking less critical.

Diodes D5 and D6 are fabricated over the subcollector regions of T14 and T15 producing an integral, space saving structure depicted in FIGS. 3 and 4.

Each of the D4 input gates are Schottky barrier diodes with low forward voltage characteristics of 0.3 volts. The D4 diodes are fabricated by depositing metal segments with a low barrier height such as titanium-tungsten or tantalum-chrome over a common subcollector bed to save space and reduce capacitance. The D4 structure is depicted in FIGS. 6 and 7.

Prior art uses additional transistors (FIG. 1) to extend logic inputs to a current switch. These additional transistors add to the collector-substrate capacitance at the out of phase output node (FIG. 1) causing non-symmetrical output waveforms from the two output nodes and degrading the performance of the circuit. The additional transistors also consume considerable silicon area. Both of the above disadvantages of the prior art are avoided in this invention by employing common cathode Schottky diodes connected to the base of the out of phase transistor T1 to extend the logic inputs. Since the logic Schottky diodes pass only small currents, their areas may be small allowing several diodes to be fabricated in the space occupied by a transistor.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. In a logical current switch adapted to receive a plurality of logical inputs each having a predetermined voltage swing and providing a first in phase logical output and a second out of phase logical output, said first and second outputs each having said predetermined voltage swing and being respectively a predetermined logical function of said plurality of inputs, said logical current switch being characterized by including only a single power supply coupled across the collector emitter current paths of at least one first bipolar transistor, which is responsive to a logical input voltage swing, and a second bipolar transistor, and further including a Schottky barrier diode connected between the emitters of said first and second bipolar transistors.

2. A logic circuit requiring a single power supply and adapted to receive a plurality of logic inputs having a predetermined signal swing and providing an in phase output and an out of phase output, said outputs respectively representing a predetermined logical function of said plurality of logical inputs, said in phase output and said out of phase output each possessing said predetermined signal swing, said logic circuit comprising:
first and second transistors, each having an emitter, base and collector;
a plurality of input terminals;
a plurality of low forward voltage Schottky barrier diodes respectively connecting each of said input terminals to the base of said first transistor;
a high forward voltage Schottky barrier diode connected between said emitter of said first transistor and said emitter of said second transistor;
a first resistor connected between said emitter of said first transistor and a source of potential;
a second resistor connected between the collector of said first transistor and ground potential;
a third resistor connected between the collector of said second transistor and ground potential;
a fourth resistor connected across said base emitter junction of said first transistor;
a direct connection between said base of said second transistor and ground potential;
an in phase output terminal connected to said collector of said second transistor; and
an out of phase output terminal connected to said collector of said first transistor.

3. A logic circuit, as recited in claim 2, said logic circuit including first and second additional Schottky barrier diodes respectively shunting said second and third resistors.

4. A current switch logical circuit requiring only a single source of electrical potential, comprising:
a plurality of transistors each having an emitter, base and collector;
a first passive connection means connecting said collectors of said plurality of transistors in common;
a second passive connection means connecting said emitters of said plurality of transistors in common;
a plurality of input terminals respectively connected to the transistor bases of said plurality of transistors;
a first resistor connected between said first connection means and ground potential;
a second resistor connected between said second connection means and a potential source;
an additional transistor having an emitter, base and collector;

a first Schottky barrier diode connected between said emitter of said additional transistor and said second connection means;

a third connection means connecting said base of said additional transistor to ground potential;

a third resistor connected between said collector of said additional transistor and ground potential; and an output terminal connected to said collector of said additional transistor.

5. A current switch logical circuit as recited in claim 3, including first and second additional Schottky barrier diodes respectively shunting said first and third resistors.

6. A current switch logical circuit requiring only a single source of electrical potential, comprising:

first, second and third transistors each having an emitter, base and collector;

a first direct connection connecting said collectors of said first, second and third transistors in common;

a second direct connection connecting said emitters of said first, second and third transistors in common;

first, second and third input terminals respectively connected to the bases of said first, second and third transistors;

a first resistor connected between said first connection and ground potential;

a second resistor connected between said second connection and a potential source;

a fourth transistor having an emitter, base and collector;

a first Schottky barrier diode connected between said emitter of said fourth transistor and said second connection;

a third direct connection connecting said base of said fourth transistor to ground potential;

a third resistor connected between said collector of said fourth transistor and ground potential;

an in phase output terminal connected to said collector of said fourth transistor; and an out of phase output terminal connected to said first direct connection.

* * * * *